US011757363B2

(12) United States Patent
Lan et al.

(10) Patent No.: US 11,757,363 B2
(45) Date of Patent: Sep. 12, 2023

(54) POWER MODULE AND POWER CONVERSION DEVICE

(71) Applicant: Delta Electronics (Shanghai) Co.,Ltd., Shanghai (CN)

(72) Inventors: Lin Lan, Shanghai (CN); Weiqiang Zhang, Shanghai (CN); Yicong Xie, Shanghai (CN); Quanliang Zhang, Shanghai (CN); Jing Rong, Shanghai (CN); Wei Zhou, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 192 days.

(21) Appl. No.: 17/449,090

(22) Filed: Sep. 28, 2021

(65) Prior Publication Data

US 2022/0149743 A1 May 12, 2022

(30) Foreign Application Priority Data

Nov. 6, 2020 (CN) .......................... 202011231927.8

(51) Int. Cl.
*H02M 3/335* (2006.01)
*H02M 3/00* (2006.01)
*H05K 7/14* (2006.01)
*H05K 7/20* (2006.01)

(52) U.S. Cl.
CPC ....... *H02M 3/33576* (2013.01); *H02M 3/003* (2021.05); *H05K 7/1432* (2013.01); *H05K 7/20927* (2013.01)

(58) Field of Classification Search
CPC ............. H02M 3/33576; H02M 3/003; H05K 7/1432; H05K 7/20927
See application file for complete search history.

(56) References Cited

U.S. PATENT DOCUMENTS

| | | | |
|---|---|---|---|
| 2009/0267466 A1* | 10/2009 | Zook | ...................... E05C 9/043 16/110.1 |
| 2012/0218658 A1* | 8/2012 | Fry | ...................... G11B 15/672 |
| 2017/0207607 A1 | 7/2017 | Lee | |

FOREIGN PATENT DOCUMENTS

| | | |
|---|---|---|
| CN | 101710793 A | 5/2010 |
| CN | 106953502 A | 7/2017 |
| CN | 110890831 A | 3/2020 |
| EP | 3618206 A1 | 3/2020 |

* cited by examiner

*Primary Examiner* — Adolf D Berhane
*Assistant Examiner* — Afework S Demisse
(74) *Attorney, Agent, or Firm* — CKC & Partners Co., LLC

(57) ABSTRACT

The invention discloses a power module and a power conversion device. The power module includes a primary converting unit including a first active device unit; a secondary converting unit including a second active device unit; a transformer including a primary unit connected to the primary converting unit and a secondary unit connected to the secondary converting unit; a first heat dissipating unit on which the primary unit and the first active device unit are disposed; a second heat dissipating unit on which the secondary unit and the second active device unit are disposed; and an insulating plate including an insulating plate body and a semi-conducting layer disposed on a surface of the insulating plate body.

17 Claims, 14 Drawing Sheets

POWER MODULE AND POWER CONVERSION DEVICE

CROSS-REFERENCE TO RELATED APPLICATIONS

This non-provisional application claims priority under 35 U.S.C. § 119(a) on Patent Application No. 202011231927.8 filed in P.R. China on Nov. 6, 2020, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The invention relates to the technical field of electric power, and particularly to a power module and a power conversion device.

BACKGROUND

With gradual growth of market demand for electric vehicles, production and sales of electric vehicles are continuously increased, and have a tendency to exceed those of the traditional vehicles. Moreover, demand for charging facilities which function as important accessories, is also increasing rapidly, and performance required by the market is also continuously improved.

Meanwhile, since our country classifies data center into new infrastructure, rapid construction of big data center, which functions as infrastructure of intelligent economic base, becomes an inevitably demand. The IT investment of Chinese data center in 2019 has reached RMB 369.81 billion, and it is predicted that investment in 2020 will be increased by 12.7%, and reach RMB 416.68 billion. As is predicted, investment in 2025 will reach RMB 707.09 billion, so demand for power equipment of the data center also faces explosive growth.

As a core component in the power equipment of electric vehicles and data centers, the power module also faces greater challenge and higher requirement. As shown in FIG. 1, a structure of the current power module 100' is illustrated, wherein a high voltage chamber 101' and a low voltage chamber 102' of the power module 100' are arranged in parallel and next to each other, a high voltage unit 10' is located in the high voltage chamber, a low voltage unit 20' and a transformer 30' are located in the low voltage chamber 102', and the high voltage unit 10' and the transformer 30' are connected by a cable 40'. Moreover, a fan unit 50' is on a surface of the high voltage chamber 101' and the low voltage chamber 102'. Such structure has the following disadvantages. (1) Sequential arrangement of internal structure of the module causes a large height, so that the power module is not easy to be carried. The high voltage chamber is deep, which lead to difficulty in connecting and fixing the cable and the optical fiber. (2) mask-type housing insulation of the housing causes a large size, a heavier weight and a high cost of the module.

In addition, the current power module product commonly has the following deficiencies. (1) The power devices are arranged unreasonably, and layout of the transformer is placed obliquely, which lead to waste of space, and a low power density. (2) A total wind tunnel is long, and wind resistance is large, such that improvement of heat dissipation capability of the product is limited. (3) The number of cooling fins is large, and the cooling fins are scattered, such that assembly is complicated. (4) Shape of the insulating housing is complicated, the mold is complicated, and accuracy of the insulating housing is low.

SUMMARY

An object of the invention is to provide a power module and a power conversion device, which can solve at least one or more deficiencies of the prior art, and can efficiently improve a power density of the power module while simplifying procedures of assembling and fabricating, thereby better conforming to market demand, and improving product competitiveness.

To realize the object, the invention provides a power module, comprising: a primary converting unit comprising a first active device unit; a secondary converting unit comprising a second active device unit; a transformer comprising a primary unit and a secondary unit, wherein the primary unit is connected to the primary converting unit, and the secondary unit is connected to the secondary converting unit; a first heat dissipating unit on which the primary unit and the first active device unit are disposed; a second heat dissipating unit on which the secondary unit and the second active device unit are disposed; and an insulating plate comprising an insulating plate body and a semi-conducting layer disposed on a surface of the insulating plate body; wherein the primary converting unit, the primary unit and the first heat dissipating unit are located at a first side of the insulating plate, the secondary converting unit, the secondary unit and the second heat dissipating unit are located at a second side of the insulating plate, and the semi-conducting layer covers projections of the transformer, the primary converting unit and the secondary converting unit on the insulating plate.

In one embodiment of the invention, the primary unit and the first active device unit are located at a same side of the first heat dissipating unit, and the secondary unit and the second active device unit are located at a same side of the second heat dissipating unit.

In one embodiment of the invention, the primary converting unit further comprises a first passive device unit, and the secondary converting unit further comprises a second passive device unit.

In one embodiment of the invention, the first active device unit and the first passive device unit are stacked, and the second active device unit and the second passive device unit are stacked.

In one embodiment of the invention, the first passive device unit and the first heat dissipating unit are disposed side by side, and the second passive device unit and the second heat dissipating unit are disposed side by side.

In one embodiment of the invention, the primary unit and the first active device unit are located at two opposite sides of the first heat dissipating unit, and the secondary unit and the second active device unit are located at two opposite sides of the second heat dissipating unit.

In one embodiment of the invention, the power module further comprises: a first insulating housing inside which the primary converting unit, the first heat dissipating unit and the primary unit are disposed.

In one embodiment of the invention, a section of the first insulating housing is a C-shape, the first insulating housing is spliced, or integrated with the insulating plate to form a first housing, and a an outer surface of the first housing is sprayed with a zinc spraying layer except a region where the semi-conducting layer is formed.

In one embodiment of the invention, the zinc spraying layer is grounded.

In one embodiment of the invention, the power module further comprises: a second insulating housing inside which the secondary converting unit, the second heat dissipating unit and the secondary unit are disposed.

In one embodiment of the invention, a section of the second insulating housing is a C-shape, and the second insulating housing is spliced with the insulating plate.

In one embodiment of the invention, the first heat dissipating unit and/or the second heat dissipating unit are liquid-cooling heat dissipating units.

In one embodiment of the invention, the first heat dissipating unit and/or the second heat dissipating unit are air-cooling heat dissipating units, and the power module further comprises a fan unit correspondingly disposed at an end of the insulating plate.

In one embodiment of the invention, the fan unit comprises a first fan and a second fan correspondingly disposed at a first end of the insulating plate, and lactated at both sides of the insulating plate, respectively.

To realize the object, the invention further provides a power conversion device, comprising: a cabinet; and a plurality of power modules as described above, arranged side by side in the cabinet.

BRIEF DESCRIPTION OF THE DRAWINGS

The exemplary embodiments will be described in detail with reference to the accompanying drawings, through which the above and other features and advantages of the invention will become more apparent.

DETAILED DESCRIPTION

Figure 1:
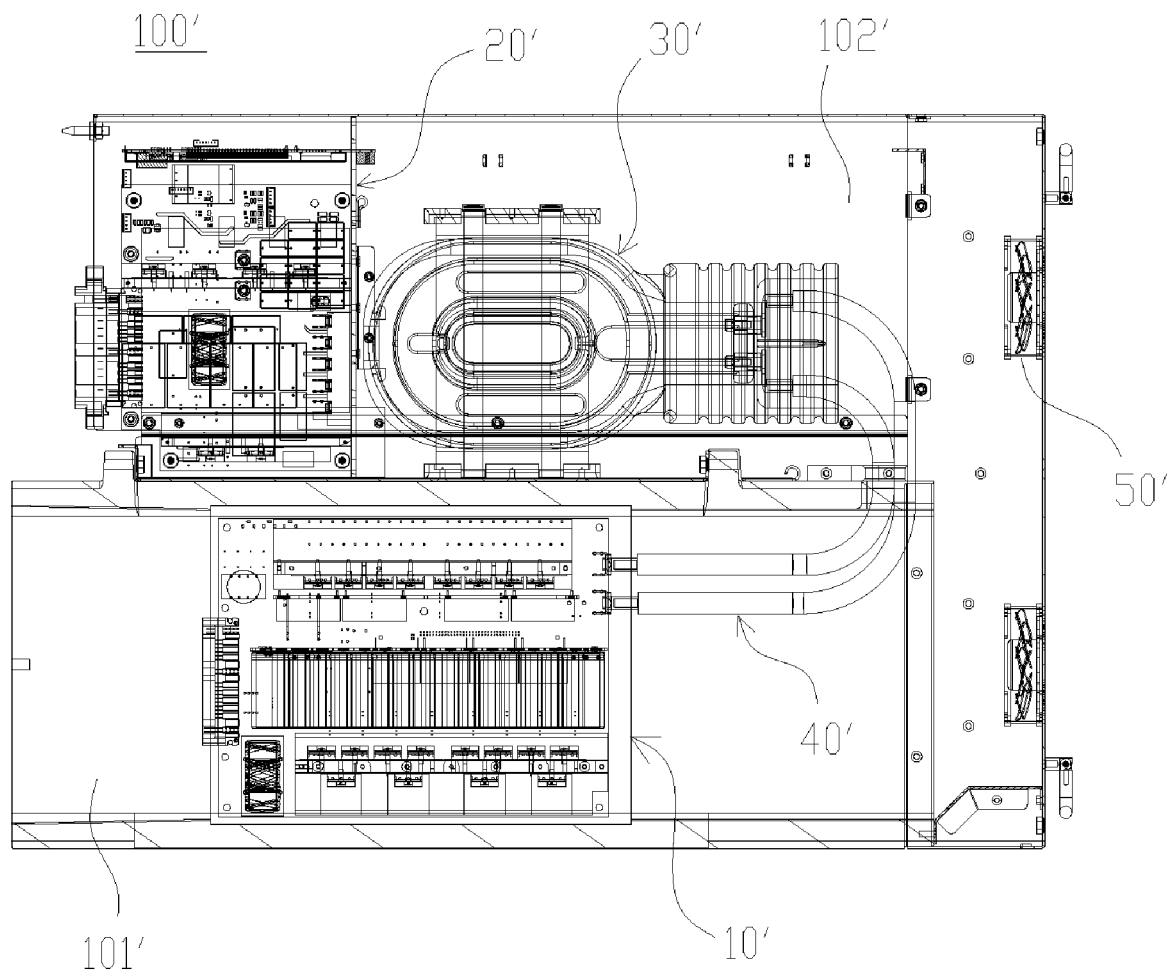
FIG. 1 is a structural diagram of the current power module.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this invention will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It shall be understood that if the signed device reverses to turn upside down, the described component on an "upper" side will become a component on a "lower" side. In addition, the terms "first", "second" and the like in the claims are only used as signs, instead of numeral limitations to objects.

As shown in FIGS. 2A-2E, a power module 100-1 in the first preferable embodiment of the invention comprises a primary converting unit 10, a secondary converting unit 20, a transformer 30, a first heat dissipating unit 41, a second heat dissipating unit 42 and an insulating plate 50. The primary converting unit 10 may comprise a first active device unit 11. The secondary converting unit 20 may comprise a second active device unit 21. The transformer 30 may comprise a primary unit 31 and a secondary unit 32, wherein the primary unit 31 is connected to the primary converting unit 10, and the secondary unit 32 is connected to the secondary converting unit 20. The primary unit 31 and the first active device unit 11 are disposed at the first heat dissipating unit 41, and the secondary unit 32 and the second active device unit 21 are disposed at the second heat dissipating unit 42. The insulating plate 50 may comprise an insulating plate body and a semi-conducting layer disposed on a surface of the insulating plate body. For example, referring to FIG. 2A, a semi-conducting layer (not shown) can be coated on two opposite surfaces 51 and 52 at left and right side of the insulating plate 50, respectively. The primary converting unit 10, the primary unit 31 and the first heat dissipating unit 41 are located at a first side (e.g., a left side) of the insulating plate 50, and the secondary converting unit 20, the secondary unit 32 and the second heat dissipating unit 42 are located at a second side (e.g., a right side) of the insulating plate 50. Moreover, the semi-conducting layer covers projections of the transformer 30, the primary converting unit 10 and the secondary converting unit 20 on the insulating plate 50.

Figure 2A:
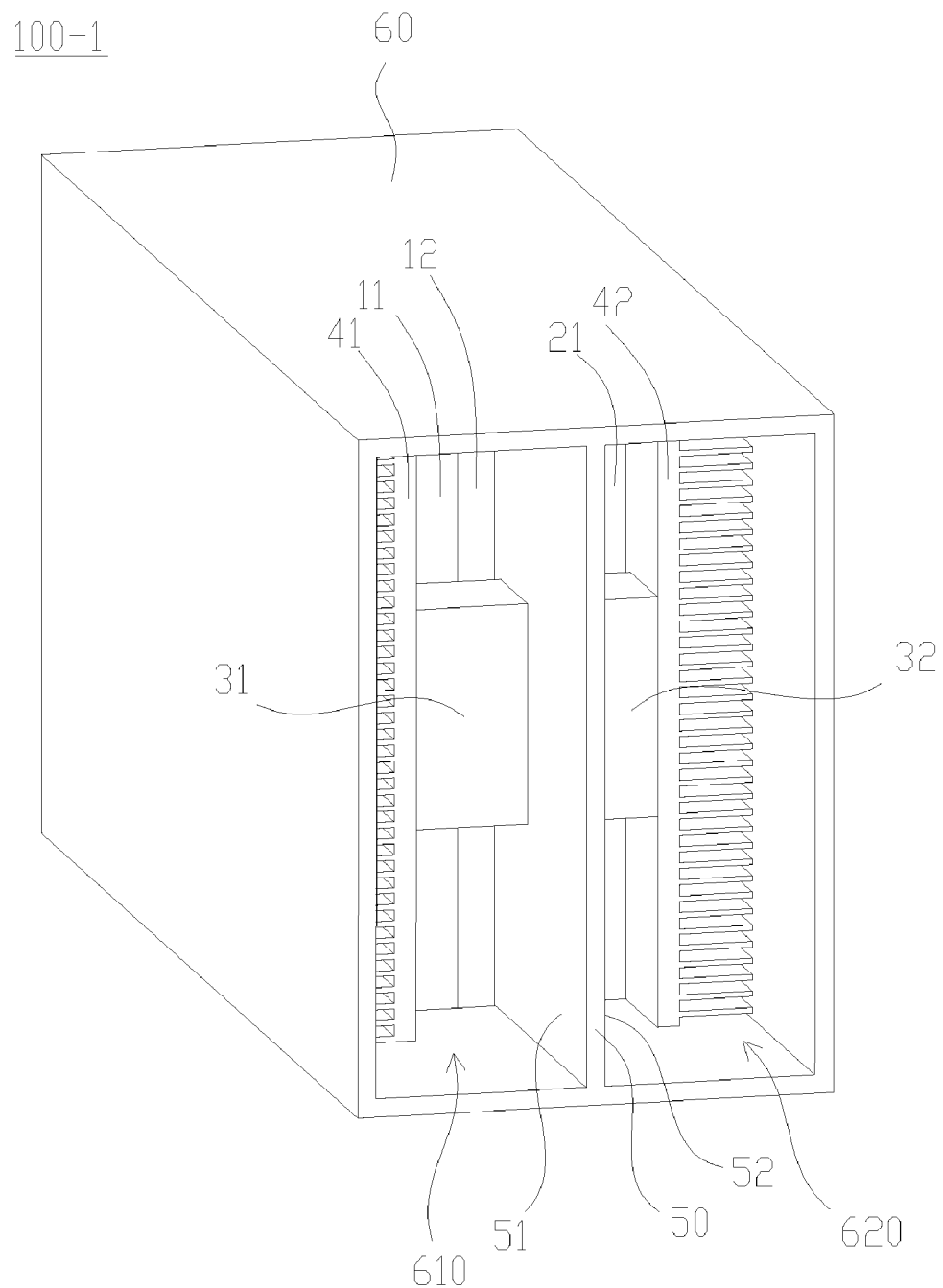
FIG. 2A is a structural diagram of a power module in the first preferable embodiment of the invention.
Figure 2B:
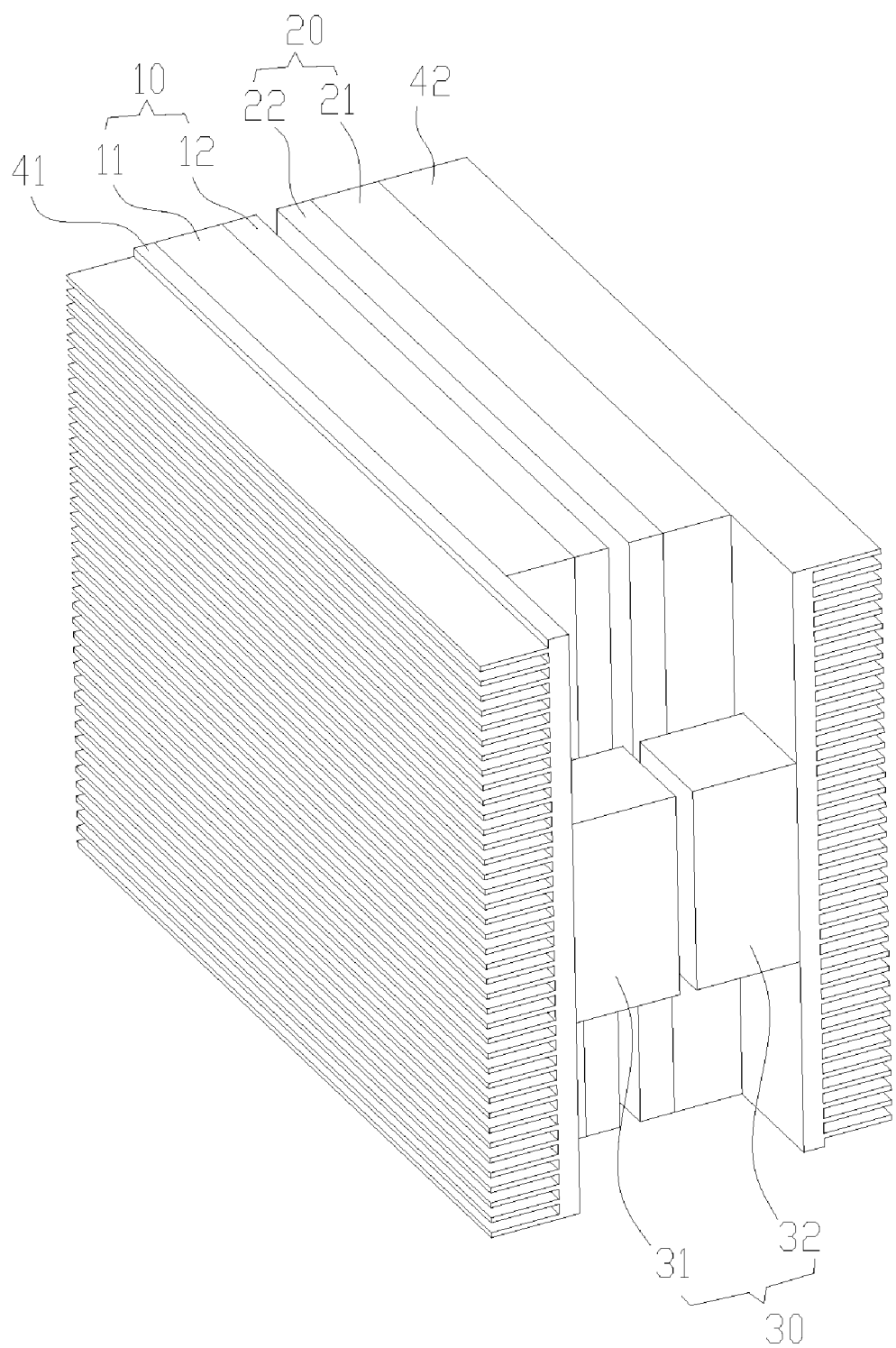
FIG. 2B is a schematic diagram of an assembled structure of the power module of FIG. 2A after removing a housing.
Figure 2C:
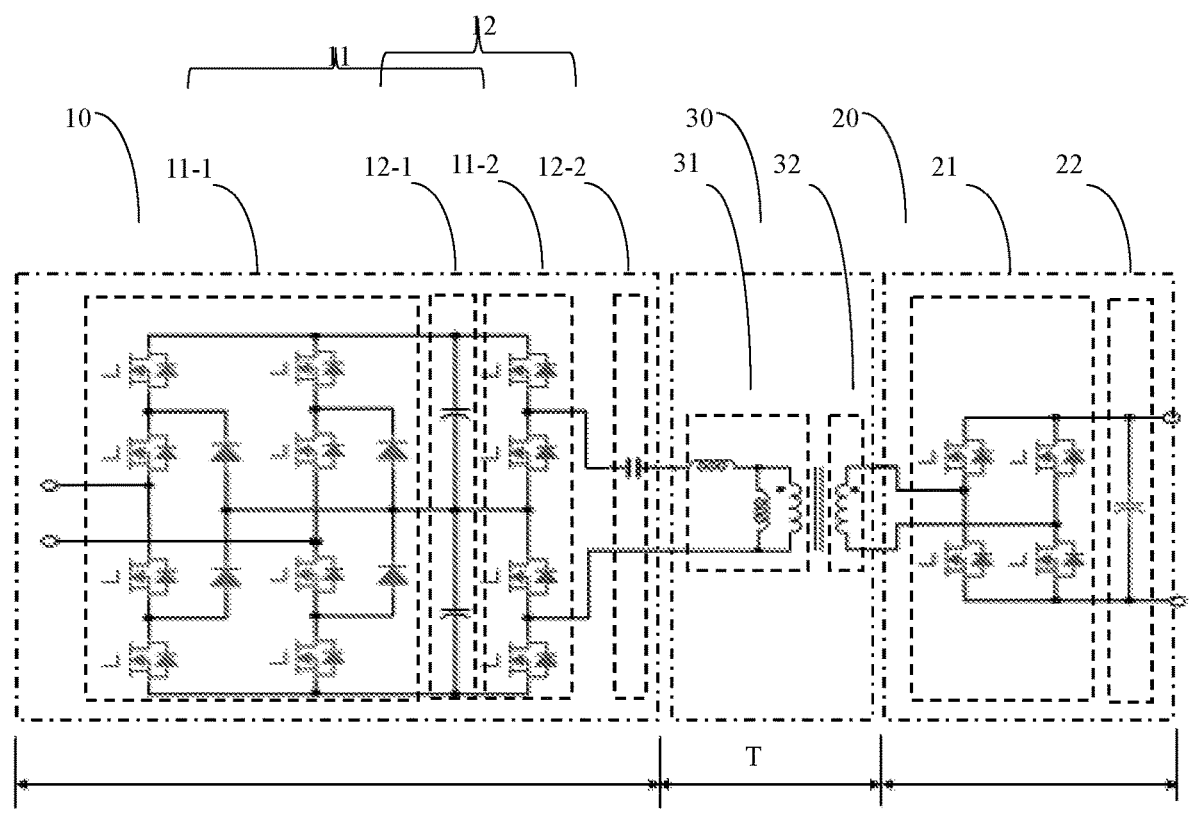
FIG. 2C is a structural diagram of one preferable circuit of the power module according to the invention.
Figure 2D:
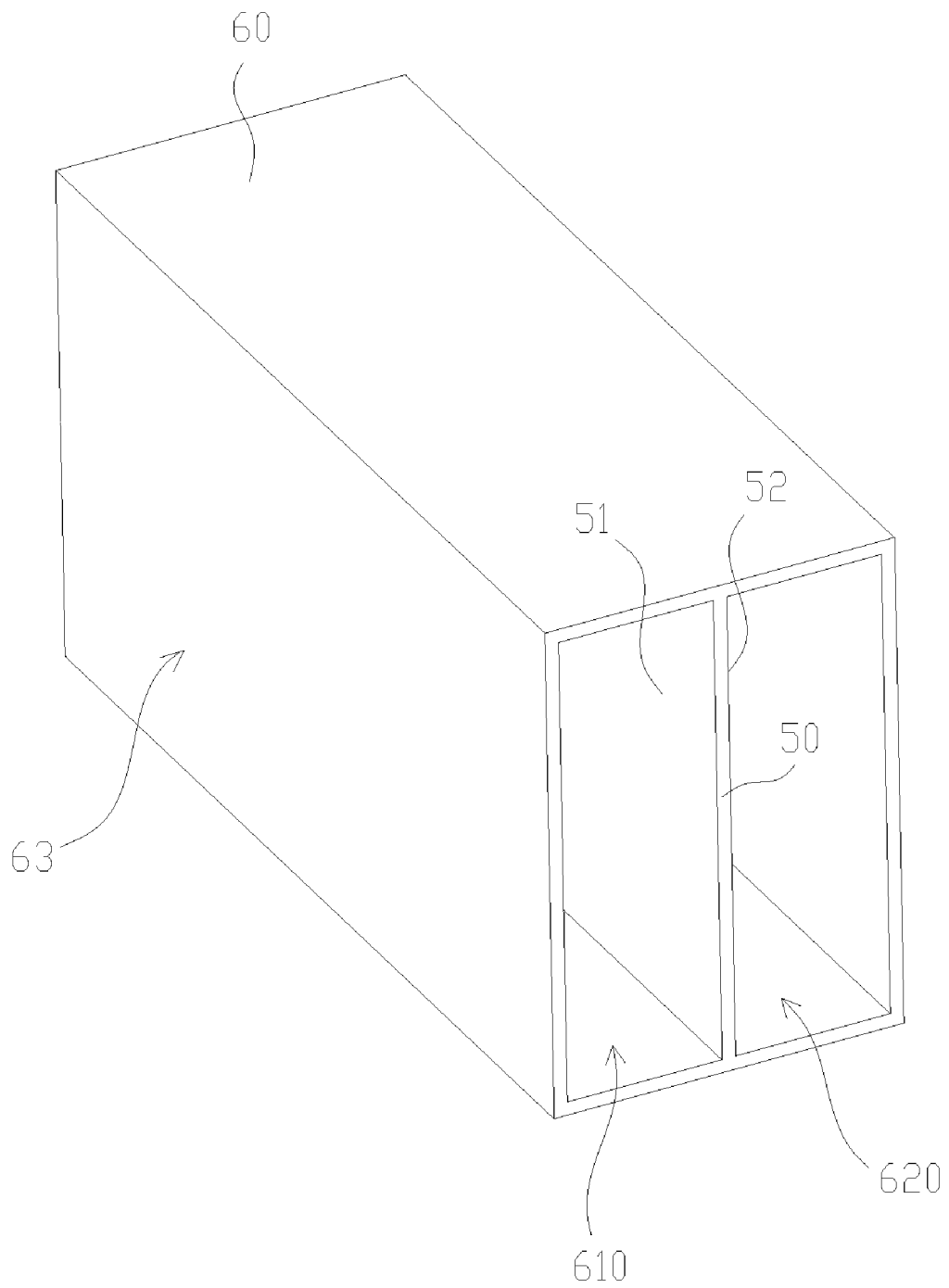
FIG. 2D is a structural diagram of the housing in the power module of FIG. 2A.
Figure 2E:
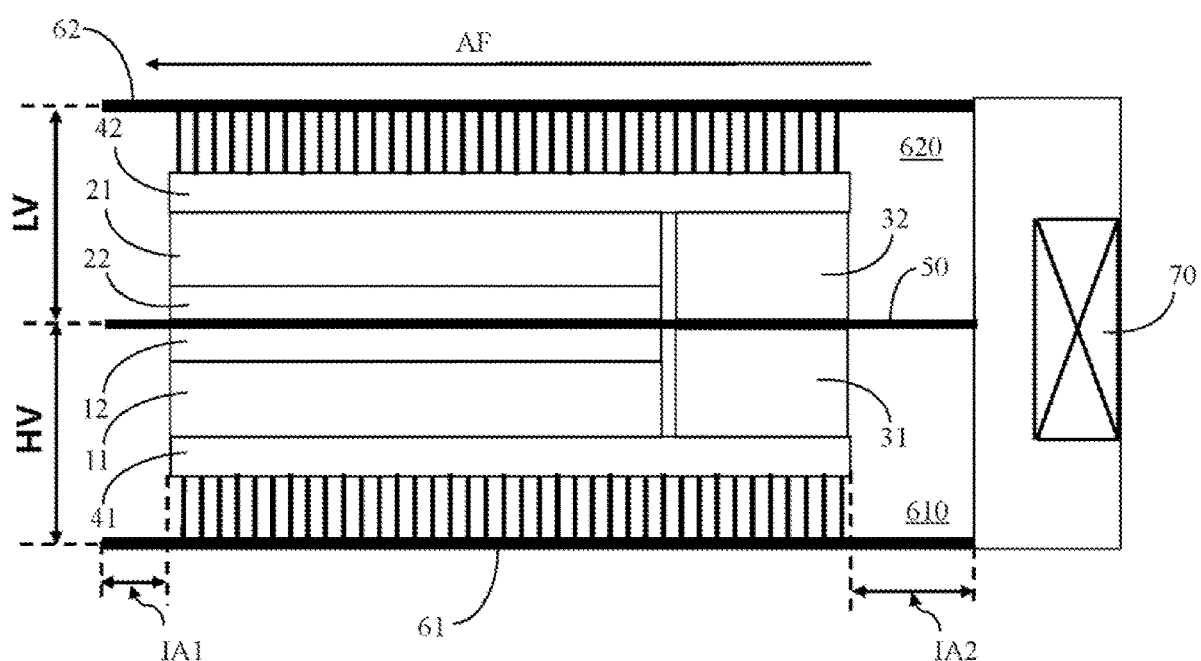
FIG. 2E is a schematic diagram of a sectional structure, viewing from top, of the power module of FIG. 2A, wherein one end of the power module is further provided with a fan unit.
Figure 2F:
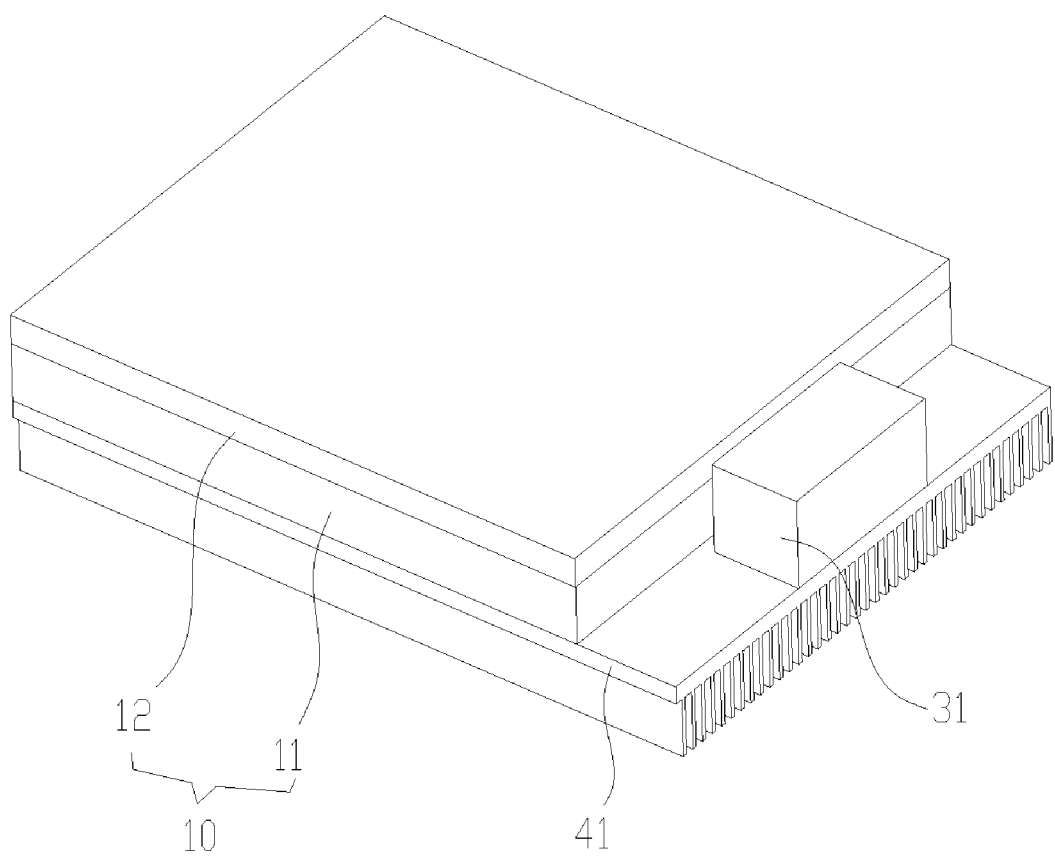
FIG. 2F is a structural diagram of a primary converting unit, a primary unit of a transformer and a first heat dissipating unit after being assembled, wherein a first active device unit and a first passive device unit of the primary converting unit are stacked.

As shown in FIGS. 2B, 2E and 2F, in this embodiment, the primary converting unit 10 may further comprise a first passive device unit 12, and the first active device unit 11 and the first passive device unit 12 may be stacked. The secondary converting unit 20 may further comprise a second passive device unit 22, and the second active device unit 21 and the second passive device unit 22 may be stacked.

Preferably, the primary unit 31 and the first active device unit 11 may be located on the same side of the first heat dissipating unit 41, as shown in FIGS. 2B, 2E and 2F. The secondary unit 32 and the second active device unit 21 may be located on the same side of the second heat dissipating unit 42.

In this embodiment, the power module 100-1 may further comprise a housing 60. The housing 60, for example, may be an insulating housing, and may be a hollow rectangular structure. More preferably, the insulating plate 50 and the housing 60 are integrally formed. A hollow space of the housing 60 is divided by the insulating plate 50 into left and right accommodating spaces 610 and 620. The primary converting unit 10, the first heat dissipating unit 41 and the primary unit 31, for example, may form a high voltage unit HV of the power module and the high voltage unit HV is arranged in the accommodating space 610. The secondary converting unit 20, the second heat dissipating unit 42 and the secondary unit 32, for example, may form a low voltage unit LV of the power module and the low voltage unit LV is arranged in the accommodating space 620. Preferably, an outer lateral surface of the housing 60 may be sprayed with a zinc spraying layer (not shown).

As shown in FIG. 2C, it illustrates a structure of one preferable circuit of the power module according to the invention. The circuit comprises a transformer T, a primary converting unit at a high-voltage side, and a secondary converting unit at a low-voltage side. Referring to FIG. 2B, a primary side and an inductor connected thereto (a leakage inductor of the transformer in this embodiment) of the transformer T, for example, form the primary unit 31 of the transformer 30 in FIG. 2B, and a secondary side of the transformer T, for example, form the secondary unit 32 of the transformer 30 in FIG. 2B. A circuit 11-1 including a plurality of transistors and diodes and a circuit 11-2 including a plurality of transistors in the primary converting unit, for example, may be encapsulated as the first active device unit 11 of the primary converting unit 10 in FIG. 2B, and a circuit 12-1 including a plurality of capacitors and a circuit 12-2 including primary capacitors in the primary converting unit, for example, may be encapsulated as the first passive device unit 12 of the primary converting unit 10 in FIG. 2B. A circuit including a plurality of transistors in the secondary converting unit, for example, may be encapsulated as the second active device unit 21 of the secondary converting unit 20 in FIG. 2B, and a circuit including one capacitor in the secondary converting unit, for example, may be encapsulated as the second passive device unit 22 of the secondary converting unit 20 in FIG. 2B. FIG. 2C only illustrates the structure of one preferable circuit of the invention, but it shall be understood that the circuit of the power module of the invention is not limited thereto, and the invention is not limited thereto.

In this embodiment, the first heat dissipating unit 41 and/or the second heat dissipating unit 42, for example, may be liquid-cooling heat dissipating units. In other embodiments, the first heat dissipating unit 41 and/or the second heat dissipating unit 42, for example, may be air-cooling heat dissipating units, and in this case, the power module 100-1 may further comprise a fan unit 70, as shown in FIG. 2E, and the fan unit 70 may be disposed at one end (e.g., right end) of the insulating plate 50 correspondingly. Preferably, the fan unit 70 may comprise a first fan and a second fan disposed at a first end (e.g., a right end) of the insulating plate 50 correspondingly, and located at both sides of the insulating plate 50, respectively. Airflow may be generated by the fan unit 70, and may flow along an airflow direction AF in FIG. 2E to cool unit devices in the accommodating spaces 610 and 620. In other embodiments, the first heat dissipating unit 41 and/or the second heat dissipating unit 42 may also be compatible with both air-cooling and liquid-cooling heat dissipation.

In this embodiment, as shown in FIG. 2E, after the high voltage unit HV and the low voltage unit LV are assembled with the housing 60, a first insulating region IA1 and a second insulating region IA2 may also be formed at left and right ends of the housing 60, respectively.

By sharing the insulating plate 50 coated with a semi-conducting layer, the primary converting unit 10 and the secondary converting unit 20, and the primary unit 31 and the secondary unit 32 of the transformer 30 can be arranged closely to the insulating plate 50. Therefore, requirement for electrical safety can be satisfied and a size of the power unit can be reduced. Moreover, the invention enables components to be highly matched by separating the active units from the passive units.

The power device and the transformer of the power module in the first preferable embodiment can realize concentrated heat dissipation, and have few cooling components (in a case of liquid-cooling heat dissipation, Ingress Protection (IP) grade of the power unit can be improved), thereby simplifying assembly. Moreover, the transformer can be pre-assembled with the heat dissipating units, and the installation is easy. The primary and secondary units of the transformer and the primary and secondary converting units can be assembled outside the housing, thereby simplifying connection. Shape of the insulating plate is regular, structure of the mold is simple, and accuracy is high.

The power module in the first preferable embodiment further improves heat dissipation capability by optimizing the wind tunnel and reducing the wind resistance. Moreover, it can realize compatibility of air-cooling and liquid-cooling heat dissipation.

Figure 3A:
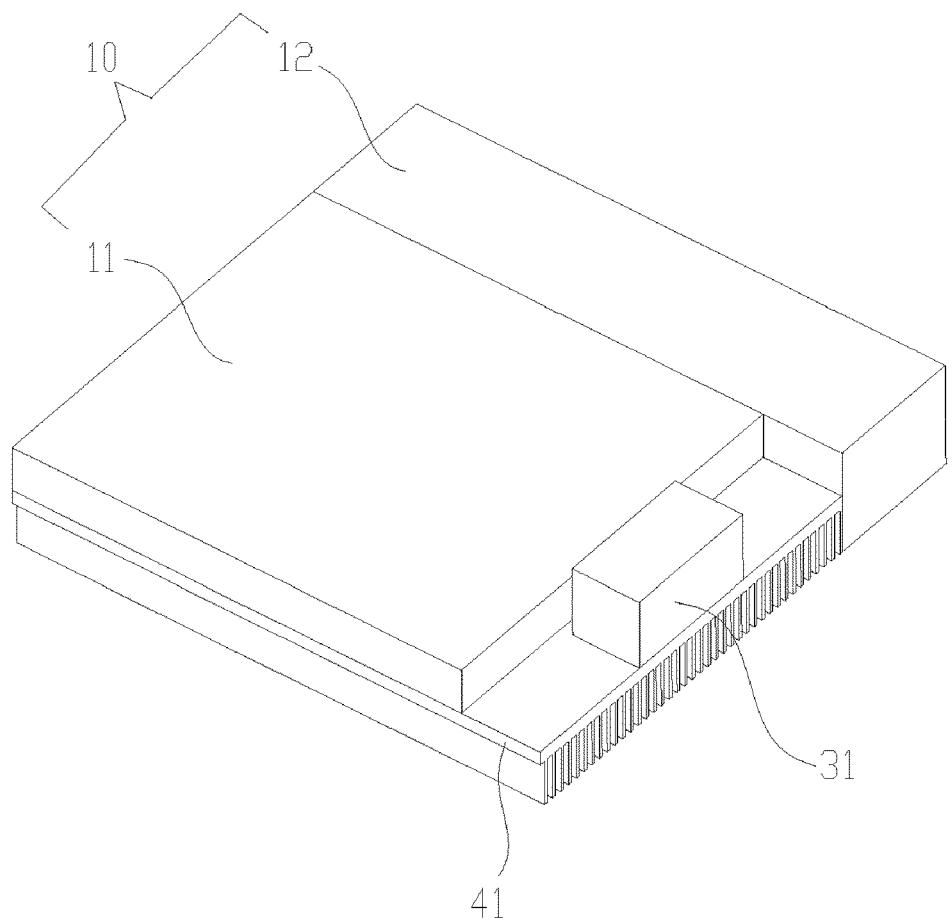
FIG. 3A is a structural diagram of a primary converting unit, a primary unit of a transformer and a first heat dissipating unit of a power module in the second preferable embodiment of the invention after being assembled, wherein a first active device unit and a first passive device unit of the primary converting unit are disposed side by side.

In a power module of the second preferable embodiment of the invention, the high voltage unit (as shown in FIG. 2E) and the low voltage unit (as shown in FIG. 2E) of the power module in the first preferable embodiment, for example, are replaced by structures shown in FIG. 3A. For example, the first passive device unit 12 and the first heat dissipating unit 41 may be disposed side by side, as shown in FIG. 3A, and the second passive device unit 22 and the second heat dissipating unit 42 may also be disposed side by side (not shown).

Figure 3B:
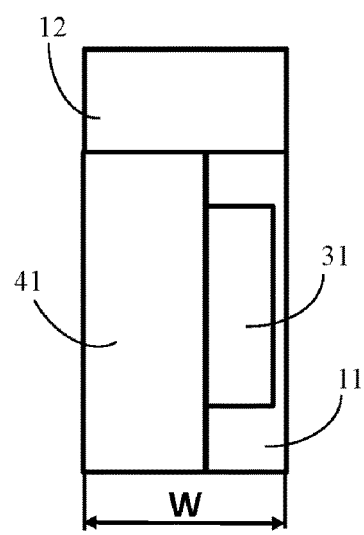
FIG. 3B is a side view of FIG. 3A.

The power module in the second preferable embodiment may narrow a width W (as shown in FIG. 3B) by arranging the passive device units and the heat dissipating units side by side, such that a width of the power module also can be narrowed to be suitable for a cabinet with a small width.

Figure 4A:
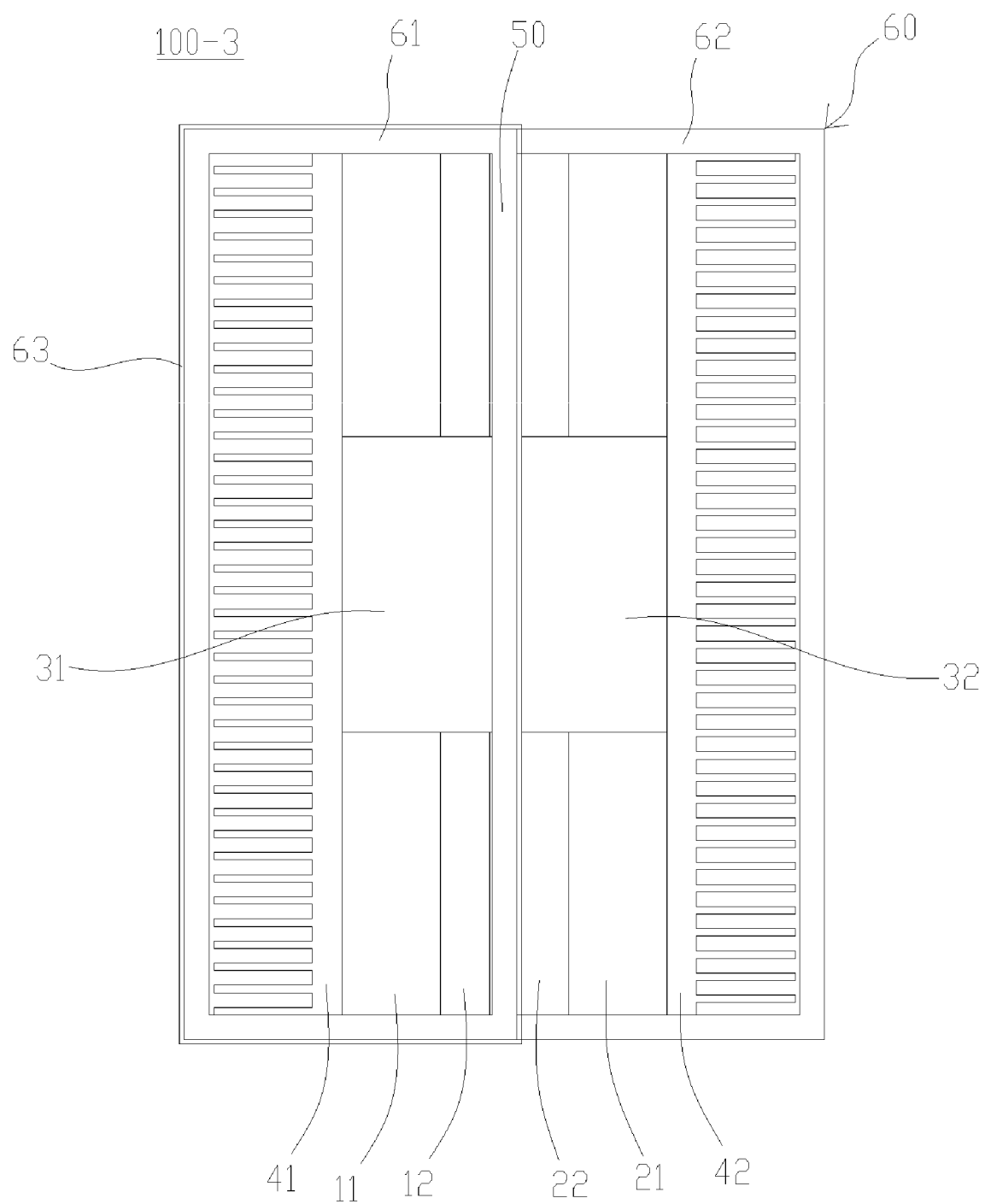
FIG. 4A is a structural diagram of a power module in the third preferable embodiment of the invention.
Figure 4B:
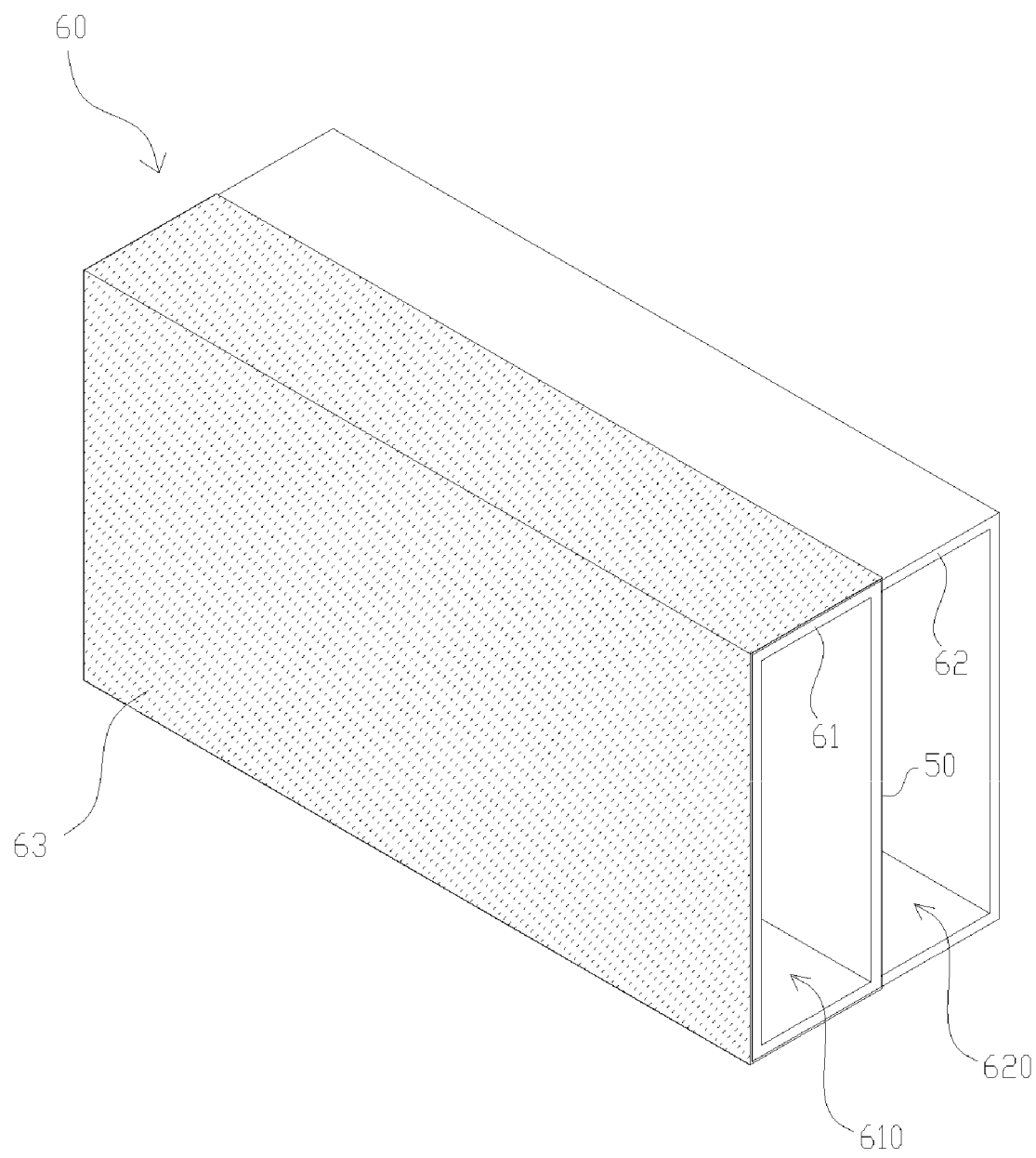
FIG. 4B is a structural diagram of a housing in the power module of FIG. 4A.

As shown in FIGS. 4A and 4B, a power module 100-3 in the third preferable embodiment of the invention differs from the power module 100-1 in the first preferable embodiment in that the housing 60 includes a first insulating housing 61 and a second insulating housing 62. A section of the first insulating housing 61, for example, may be a C-shape, the first insulating housing 61 may be spliced with the insulating plate 50 to form a first housing, and may also be integrated with the insulating plate 50 to form a first housing. A section of the second insulating housing 62, for example, may be a C-shape, and the second insulating housing 62 may be spliced with the insulating plate 50. The first active device unit 11 and the first passive device unit 12 of the primary converting unit, the first heat dissipating unit 41 and the primary unit 31 of the transformer, for example, may form a high voltage unit HV, and the high voltage unit HV is placed inside the first insulating housing 61, i.e., in the accommodating space 610. The second active device unit 21 and the second passive device unit 22 of the secondary converting unit, the second heat dissipating unit 42 and the secondary unit 32 of the transformer, for example, may form a low voltage unit LV, and the low voltage unit LV is placed inside the second insulating housing 62, i.e., in the accommodating space 620.

Preferably, the power module 100-3 in the third preferable embodiment may be further sprayed with a zinc spraying layer 63 on an outer surface of the first housing except a region where the semi-conducting layer is formed. The zinc spraying layer 63 may be grounded.

The power module 100-3 in the third preferable embodiment is grounded through the zinc spraying layer 63, so it is safe to touch. The power module 100-3 in the third preferable embodiment may also improve a partial discharge voltage of the power module.

Figure 5A:
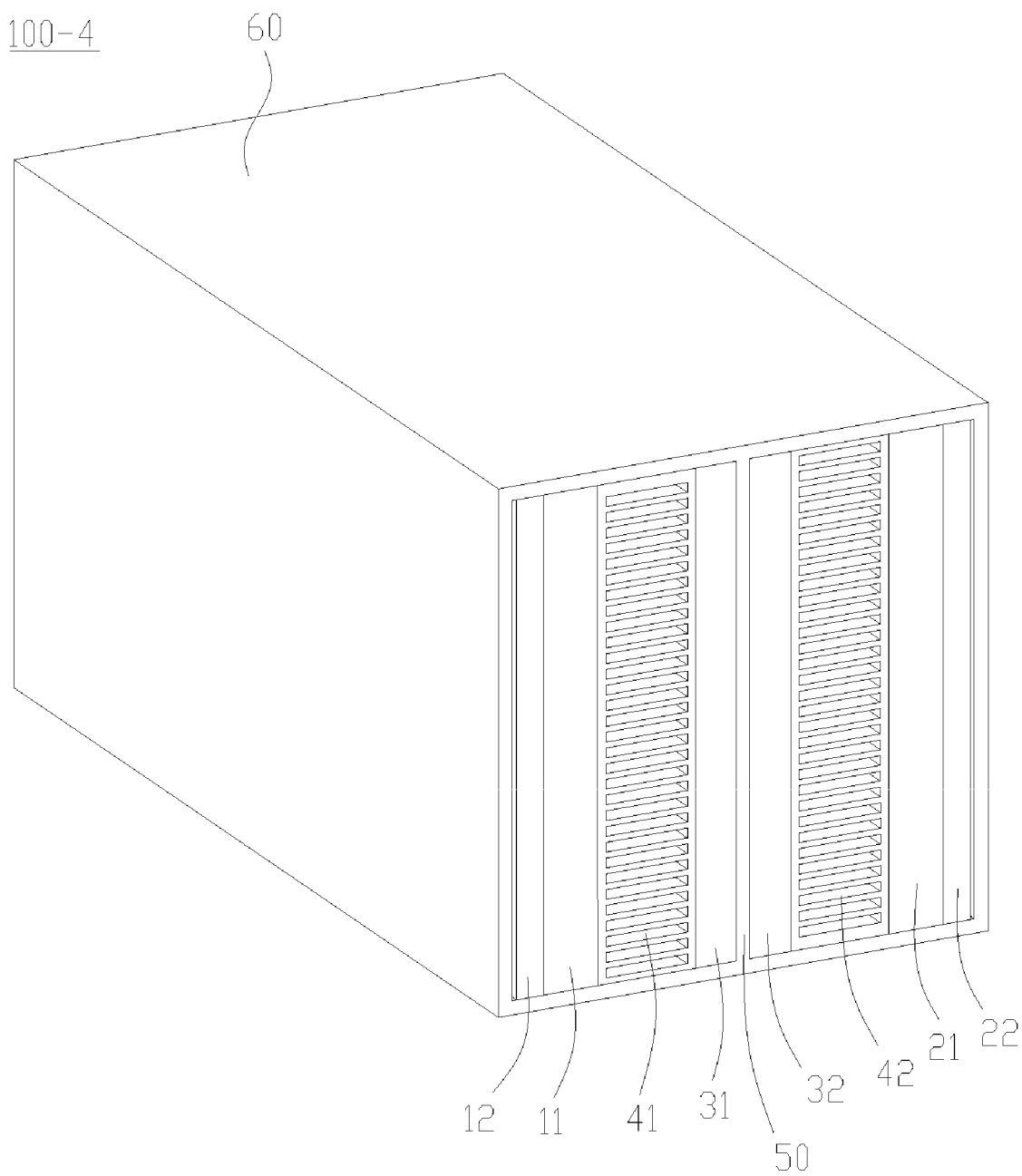
FIG. 5A is a structural diagram of a power module in the fourth preferable embodiment of the invention.
Figure 5B:
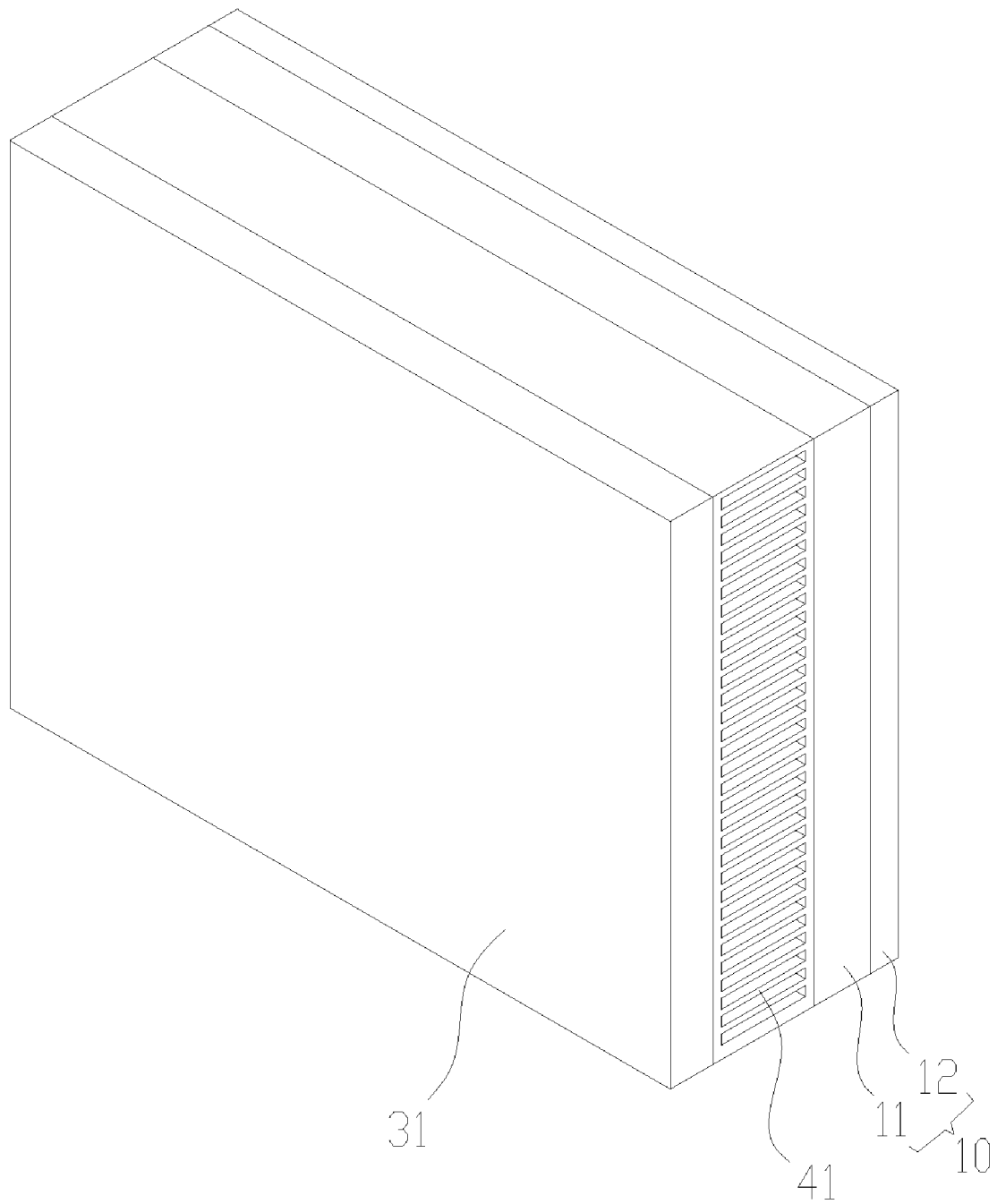
FIG. 5B is a structural diagram of a primary converting unit, a primary unit of a transformer and a first heat dissipating unit in the power module of FIG. 5A after being assembled, wherein a first active device unit of the primary converting unit and the primary unit of the transformer are located on two opposite sides of the first heat dissipating unit.

As shown in FIGS. 5A and 5B, a power module 100-4 in the fourth preferable embodiment of the invention differs from the power module 100-1 in the first preferable embodiment in that the primary unit 31 of the transformer and the first active device unit 11 of the primary converting unit 10 are located at two opposite sides of the first heat dissipating unit 41, respectively, and the secondary unit 32 of the transformer and the second active device unit 21 of the secondary converting unit 20 are located at two opposite sides of the second heat dissipating unit 42, respectively.

In this embodiment, the primary converting unit 10 further comprises a first passive device unit 12, and the first active device unit 11 and the first passive device unit 12 are stacked. The secondary converting unit 20 further comprises a second passive device unit 22, and the second active device unit 21 and the second passive device unit 22 are stacked.

The power module 100-4 in the fourth preferable embodiment can fully make use of two surfaces at two opposite sides of the heat dissipating unit, thereby reducing a size of the heat dissipating unit, such that a size of the insulating plate 50 coated with the semi-conducting layer can be reduced.

Figure 6A:
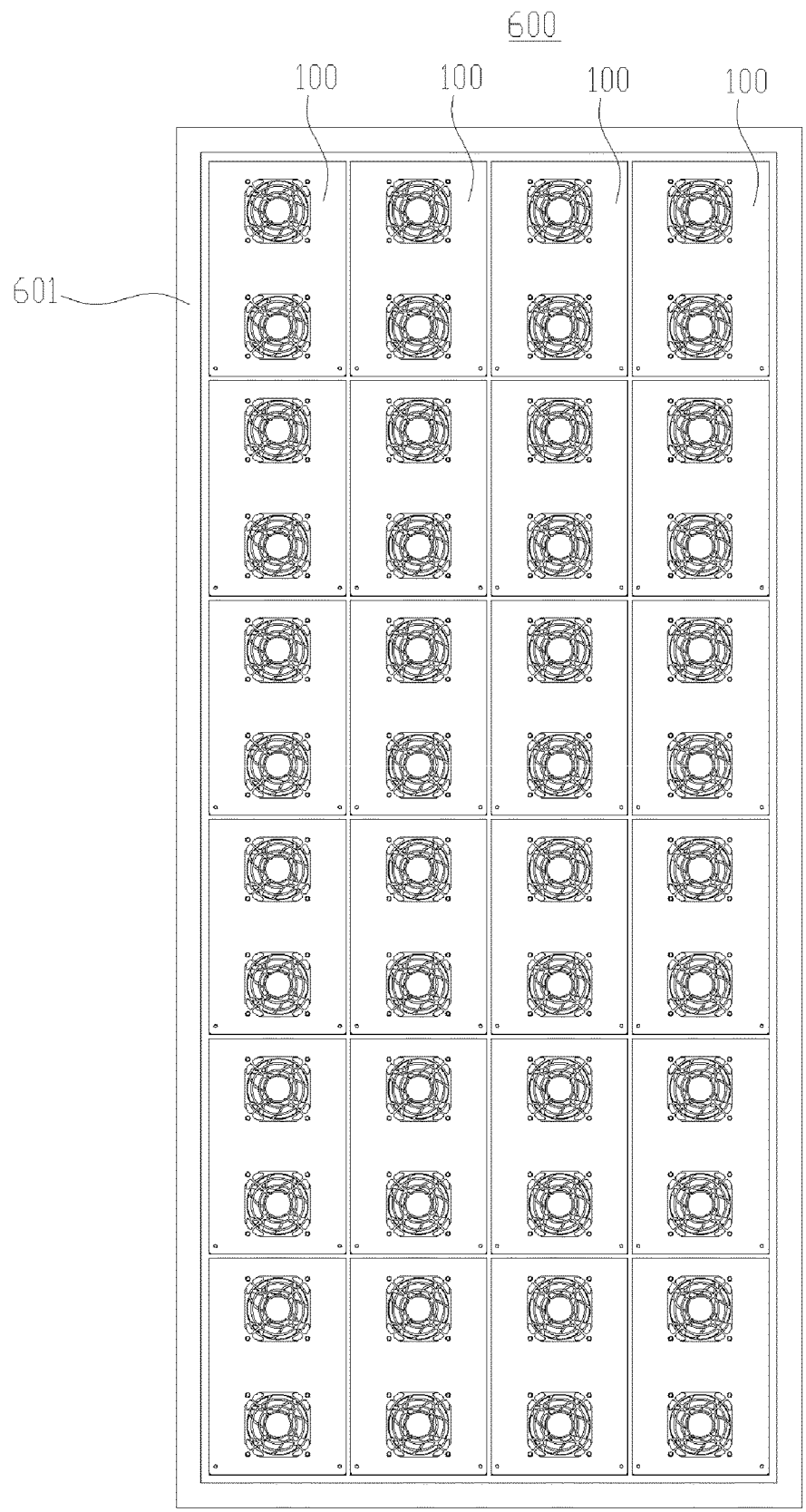
FIG. 6A is a structural diagram of a preferable power conversion device according to the invention.
Figure 6B:
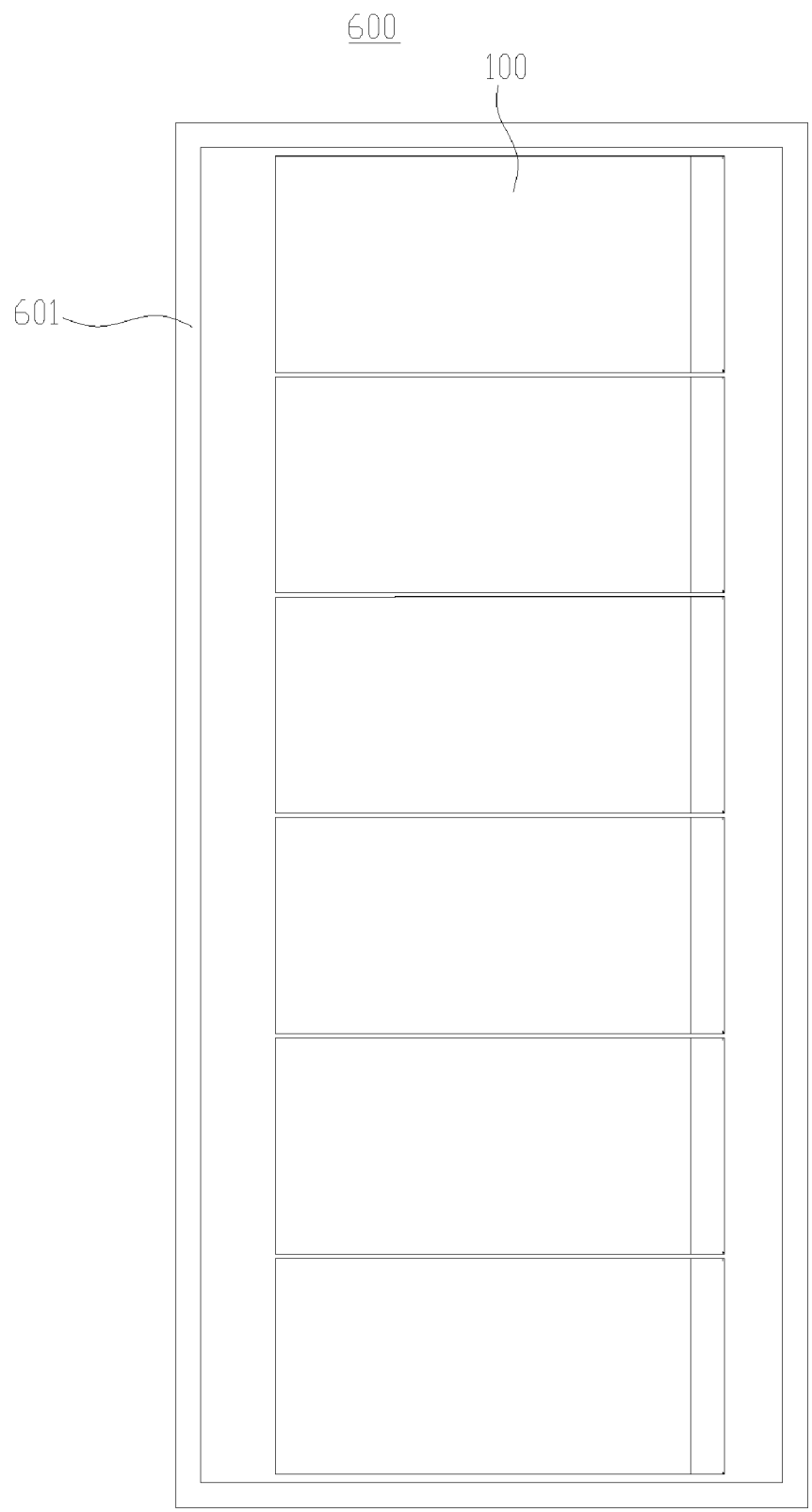
FIG. 6B is a sectional view of a lateral surface of the power conversion device of FIG. 6A.

FIGS. 6A and 6B illustrate a structure of a power conversion device 600 in the invention, comprising a cabinet 601 and a plurality of power modules (100-1, 100-3, or 100-4, etc.). The single power module, for example, may be divided into left and right sides, the left side is high voltage, and the right side is low voltage. Moreover, these power modules are arranged in parallel in the cabinet 601, and an extremely small gap is reserved among the modules after being sprayed with the zinc spraying layer and grounded, such that electrical insulation requirement can be satisfied, and a volume of the cabinet can be reduced.

Exemplary embodiments of the invention have been shown and described in detail. It shall be understood that the invention is not limited to the disclosed embodiments. Instead, the invention intends to cover various modifications and equivalent settings included in the spirit and scope of the appended claims.

What is claimed is:

1. A power module, comprising:
   a primary converting unit comprising a first active device unit;
   a secondary converting unit comprising a second active device unit;
   a transformer comprising a primary unit and a secondary unit, wherein the primary unit is connected to the primary converting unit, and the secondary unit is connected to the secondary converting unit;
   a first heat dissipating unit on which the primary unit and the first active device unit are disposed;
   a second heat dissipating unit on which the secondary unit and the second active device unit are disposed; and
   an insulating plate comprising an insulating plate body and a semi-conducting layer disposed on a surface of the insulating plate body; wherein
   the primary converting unit, the primary unit and the first heat dissipating unit are located at a first side of the insulating plate,
   the secondary converting unit, the secondary unit and the second heat dissipating unit are located at a second side of the insulating plate, and
   the semi-conducting layer covers projections of the transformer, the primary converting unit and the secondary converting unit on the insulating plate.

2. The power module according to claim 1, wherein the primary unit and the first active device unit are located at a same side of the first heat dissipating unit, and the secondary unit and the second active device unit are located at a same side of the second heat dissipating unit.

3. The power module according to claim 2, wherein the primary converting unit further comprises a first passive device unit, and the secondary converting unit further comprises a second passive device unit.

4. The power module according to claim 3, wherein the first active device unit and the first passive device unit are stacked, and the second active device unit and the second passive device unit are stacked.

5. The power module according to claim 3, wherein the first passive device unit and the first heat dissipating unit are disposed side by side, and the second passive device unit and the second heat dissipating unit are disposed side by side.

6. The power module according to claim 1, wherein the primary unit and the first active device unit are located at two opposite sides of the first heat dissipating unit, and the secondary unit and the second active device unit are located at two opposite sides of the second heat dissipating unit.

7. The power module according to claim 6, wherein the primary converting unit further comprises a first passive device unit, and the secondary converting unit further comprises a second passive device unit.

8. The power module according to claim 7, wherein the first active device unit and the first passive device unit are stacked, and the second active device unit and the second passive device unit are stacked.

9. The power module according to claim 1, further comprising:
- a first insulating housing inside which the primary converting unit, the first heat dissipating unit and the primary unit are disposed.

10. The power module according to claim 9, wherein a section of the first insulating housing is a C-shape, the first insulating housing is spliced, or integrated with the insulating plate to form a first housing, and an outer surface of the first housing is sprayed with a zinc spraying layer except a region where the semi-conducting layer is formed.

11. The power module according to claim 10, wherein the zinc spraying layer is grounded.

12. The power module according to claim 10, further comprising:
- a second insulating housing inside which the secondary converting unit, the second heat dissipating unit and the secondary unit are disposed.

13. The power module according to claim 12, wherein a section of the second insulating housing is a C-shape, and the second insulating housing is spliced with the insulating plate.

14. The power module according to claim 1, wherein the first heat dissipating unit and/or the second heat dissipating unit are liquid-cooling heat dissipating units.

15. The power module according to claim 1, wherein the first heat dissipating unit and/or the second heat dissipating unit are air-cooling heat dissipating units, and the power module further comprises a fan unit correspondingly disposed at an end of the insulating plate.

16. The power module according to claim 15, wherein the fan unit comprises a first fan and a second fan correspondingly disposed at a first end of the insulating plate, and lactated at both sides of the insulating plate, respectively.

17. A power conversion device, comprising:
- a cabinet; and
- a plurality of power modules according to claim 1, arranged in the cabinet side by side.

* * * * *